United States Patent [19]
Chan et al.

[11] Patent Number: 5,651,859
[45] Date of Patent: Jul. 29, 1997

[54] METHOD FOR MANUFACTURING A SEMICONDUCTOR MEMORY CELL WITH A FLOATING GATE

[75] Inventors: Tung-Yi Chan, San Jose, Calif.; Wen-Ying Wen, Kaohsiung Hsien, Taiwan

[73] Assignee: Winbond Electronics Corp., Hsinchu, Taiwan

[21] Appl. No.: 550,855

[22] Filed: Oct. 31, 1995

[51] Int. Cl.$^6$ .................................................. H01L 21/00
[52] U.S. Cl. ............................ 156/657.1; 156/659.11; 437/52
[58] Field of Search ...................... 156/643.1, 648.1, 156/657.1, 659.11, 662.1; 437/40, 52, 228 H, 233, 238, 241, 927

[56] References Cited

U.S. PATENT DOCUMENTS

5,380,373  1/1995  Kimura et al. .

*Primary Examiner*—William Powell
*Attorney, Agent, or Firm*—Christensen O'Connor Johnson & Kindness PLLC

[57] ABSTRACT

A method for manufacturing a semiconductor memory cell with a floating gate having a predetermined length includes the steps of: growing a thin oxide layer over a substrate; depositing a polysilicon layer over the thin oxide layer; depositing a silicon nitride layer over the polysilicon layer; masking and etching the nitride layer down to the polysilicon layer so as to form an oxide receiving groove in the nitride layer, the groove being parallel to a longitudinal axis of the floating gate to be formed and being longer than the predetermined width of the floating gate to be formed, and the width of the receiving groove in latitudal axis is equal to the predetermined length of the floating gate, the receiving groove overlapping a floating gate region to be defined on the polysilicon layer; growing a polysilicon oxide layer in the receiving groove; removing the nitride layer; providing a mask which is transverse to the polysilicon oxide layer and which has a width equal to the predetermined length of the floating gate to be formed, the mask covering a portion of the polysilicon oxide layer which is directly above the floating gate region; etching remaining portion of the polysilicon oxide layer not covered by the mask; removing the mask; and etching the polysilicon layer with the portion of the polysilicon oxide layer serving as a mask so as to form the floating gate.

2 Claims, 10 Drawing Sheets

METHOD FOR MANUFACTURING A SEMICONDUCTOR MEMORY CELL WITH A FLOATING GATE

BACKGROUND OF THE INVENTION

1. Field of the Invention

This invention relates to a semiconductor memory cell with a floating gate, more particularly to a method for manufacturing a semiconductor memory cell with a floating gate.

2. Description of the Related Art

In semiconductor memory cells which have floating gates and which are nonvolatile, information that is stored is not lost when the power supply is removed. Memory cells of this type include an erasable nonvolatile memory cell, such as a split gate EPROM (erasable programmable read only memory). In order to reduce an erase voltage of the erasable nonvolatile memory cell, a conventional split gate EPROM having floating gates has been provided. The floating gates of the conventional split gate EPROM is formed with tip along the edge of floating gate thereof by the well known LOCOS process such that a high electric field is generated between the polysilicon layers of the conventional split gate EPROM to provide an effective tunneling of the electrons from a floating gate to a control gate, thereby reducing the erase voltage.

Figure 1:
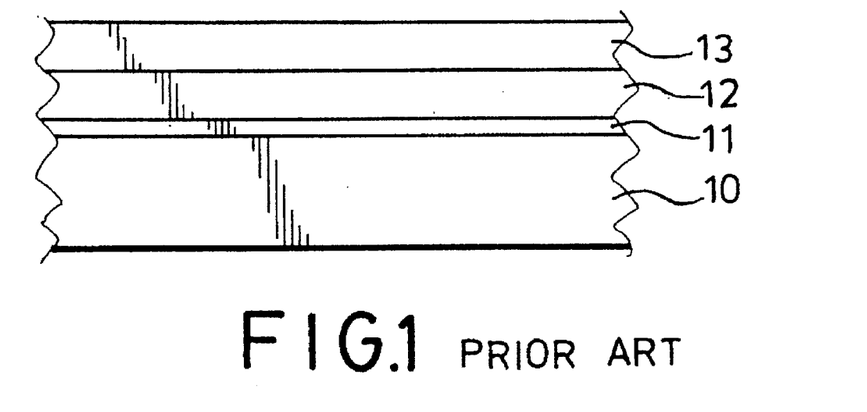
FIGS. 1 to 5 depict the steps of a conventional method for manufacturing a conventional split gate EPROM with a floating gate having a predetermined length and source and drain regions.
Figure 2:
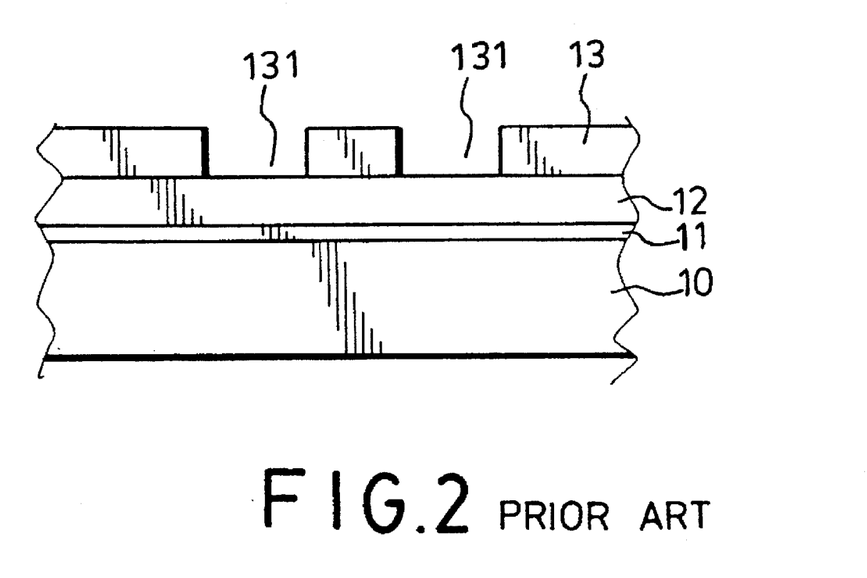
Figure 3:
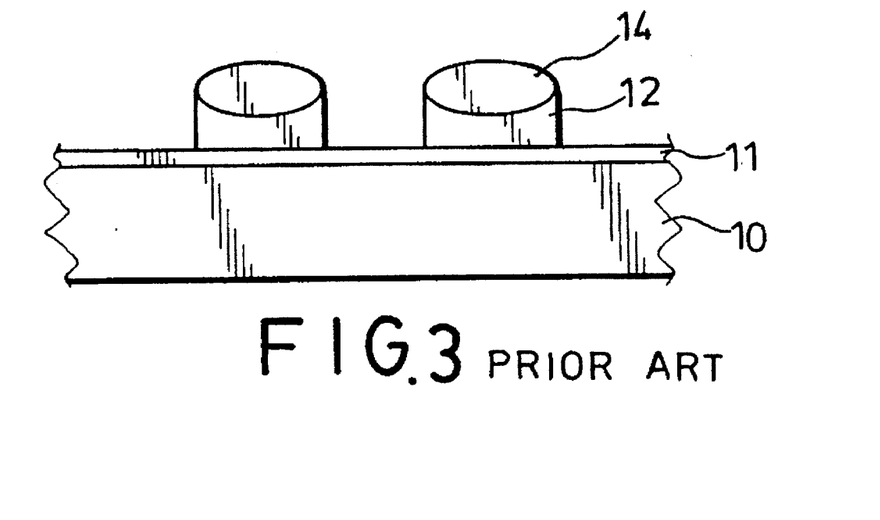
Figure 4:
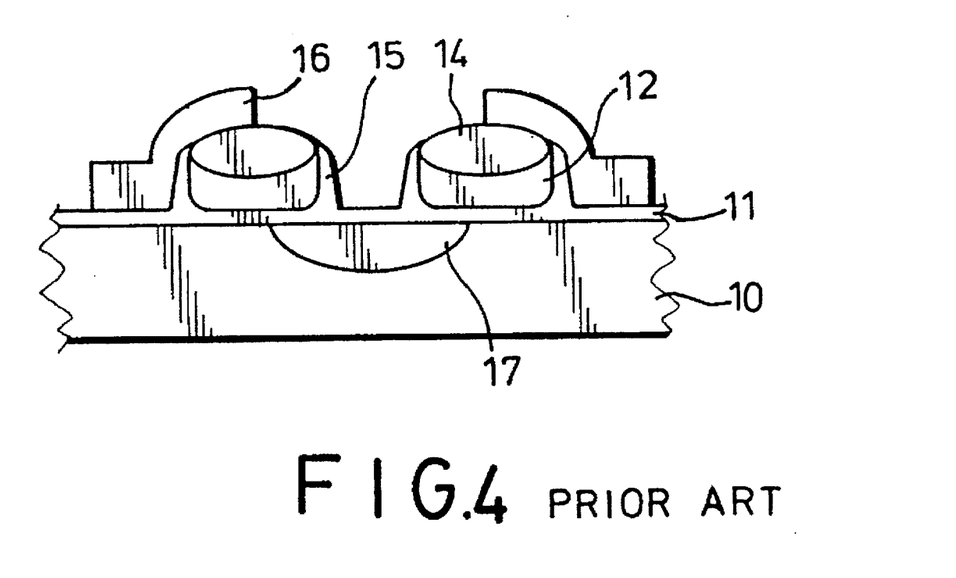
Figure 5:
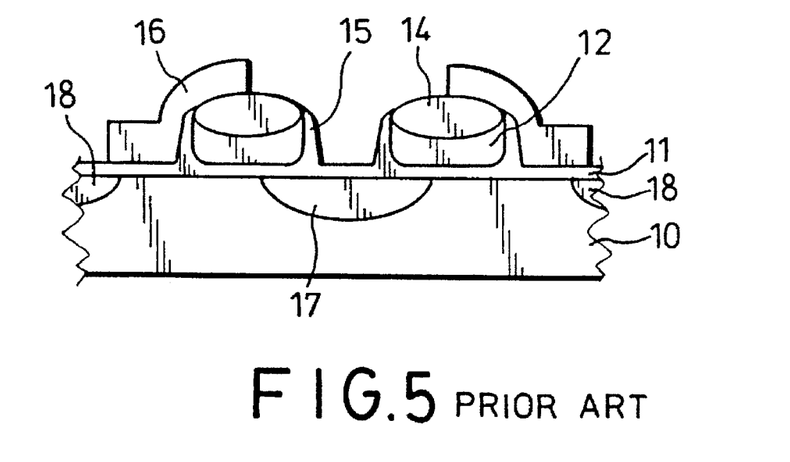

FIGS. 1 to 5 depict the steps of a conventional method for manufacturing the aforementioned conventional split gate EPROM having a floating gate with a predetermined length and source and drain regions. As illustrated in FIG. 1, a thin oxide layer 11 is grown over a semiconductor substrate 10. A first polysilicon layer 12 is deposited over the thin oxide layer 11. A silicon nitride layer 13 is deposited over the first polysilicon layer 12. Then, as illustrated in FIG. 2, the silicon nitride layer 13 is masked and etched down to the first polysilicon layer 12 so as to form oxide receiving grooves 131 in the silicon nitride layer 13. The dimension of the floating gates of memory cell is equal to dimension of the oxide receiving grooves. The oxide receiving grooves 131 overlap respective floating gate regions to be defined on the first polysilicon layer 12. As illustrated in FIG. 3, a polysilicon oxide layer 14 is grown in each oxide receiving groove, and the silicon nitride layer is removed. The first polysilicon layer 12 is etched with the polysilicon oxide layer 14 serving as a mask so as to form the floating gates with tip along the edge of floating gate. As illustrated in FIG. 4, a gate oxide layer 15 is grown over the floating gates and a second polysilicon layer 16 is deposited over the gate oxide layer 15. The second polysilicon layer 16 is masked and etched to define control gates having longitudinal axes parallel to those of the floating gates. Each of the control gates further has a first edge positioned above the respective floating gate and a second edge positioned on the gate oxide layer 15. As illustrated in FIG. 5, impurities are implanted in the drain and source regions, 18 and 17. The conventional split gate EPROM is completed by using standard CMOS processes, such as by providing a passivation layer (not shown) and metallization and electrodes that allow conduction of signals to and from external circuitry.

Figure 6A:
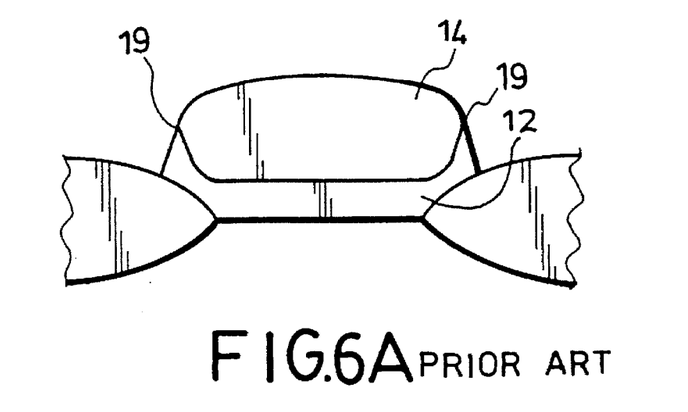
FIG. 6A is a sectional view showing the conventional split gate EPROM manufactured by the conventional method, taken along a line parallel to the longitudinal axis of the floating gate.
Figure 6B:
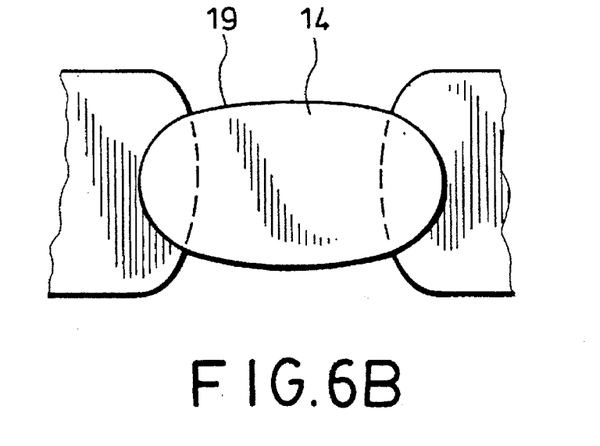
FIG. 6B is a top view of the conventional split gate EPROM of FIG. 6A.

As illustrated in FIGS. 6A and 6B, the conventional split gate EPROM manufactured by the aforementioned conventional method will encounter a problem on the pattern definition of the floating gates during the scaling down of the EPROM since the definition of oxide receiving groove portions of the floating gates will cause a rounding effect resulting from diffraction, thereby resulting in cell leakage because of reducing effective channel length of floating gate.

SUMMARY OF THE INVENTION

Therefore, the main objective of the present invention is to provide a method for manufacturing a semiconductor memory cell with a floating gate so as to minimize the occurrence of cell leakage.

In one aspect of the present invention, a method for manufacturing a semiconductor memory cell with a floating gate includes the steps of: growing a thin oxide layer over a semiconductor substrate; depositing a polysilicon layer over the thin oxide layer; depositing a silicon nitride layer over the polysilicon layer; masking and etching the silicon nitride layer down to the polysilicon layer so as to form an oxide receiving groove in the silicon nitride layer, the oxide receiving groove having a longitudinal axis parallel to a longitudinal axis of the floating gate to be formed and being longer than the width of the floating gate to be formed, and the width of the oxide receiving groove in latitudal axis is equal to the length of the floating gate to be formed, the oxide receiving groove overlapping a floating gate region to be defined on the polysilicon layer; growing a polysilicon oxide layer in the oxide receiving groove; removing the silicon nitride layer; providing a mask which is transverse to the polysilicon oxide layer and which has a width equal to the width of the floating gate to be formed, the mask covering a portion of the polysilicon oxide layer which is directly above the floating gate region; etching remaining portion of the polysilicon oxide layer not covered by the mask; removing the mask; and etching the polysilicon layer with the portion of the polysilicon oxide layer serving as a mask so as to form the floating gate.

In another aspect of the present invention, a method for manufacturing an erasable nonvolatile memory cell with a floating gate and source and drain regions spaced by a channel includes the steps of: growing a thin oxide layer over a semiconductor substrate; depositing a first polysilicon layer over the thin oxide layer; depositing a silicon nitride layer over the first polysilicon layer; masking and etching the silicon nitride layer down to the first polysilicon layer so as to form an oxide receiving groove in the silicon nitride layer, the oxide receiving groove having a longitudinal axis parallel to a longitudinal axis of the floating gate to be formed and being longer than the width of the floating gate to be formed, and the width of the receiving groove in latitudal axis is equal to the length of the floating gate to be formed, the oxide receiving groove overlapping a floating gate region to be defined on the first polysilicon layer; growing a polysilicon oxide layer in the oxide receiving groove; removing the silicon nitride layer; providing a mask which is transverse to the polysilicon oxide layer and which has a width equal to the width of the floating gate to be formed, the mask covering a portion of the polysilicon oxide layer which is directly above the floating gate region; etching remaining portion of the polysilicon oxide layer not covered by the mask; removing the mask; etching the first polysilicon layer with the portion of the polysilicon oxide layer serving as a mask so as to form the floating gate; growing a gate oxide layer over the floating gate; depositing a second polysilicon layer over the gate oxide layer; masking and etching the second polysilicon layer to define a control gate having a longitudinal axis parallel to that of the floating gate, the control gate further having a first edge positioned above the floating gate and a second edge positioned on the gate oxide layer; and implanting impurities in the drain and source regions.

BRIEF DESCRIPTION OF THE DRAWINGS

Other features and advantages of the present invention will become apparent in the following detailed description of the preferred embodiment, with reference to the accompanying drawings, of which.

DETAILED DESCRIPTION OF THE PREFERRED EMBODIMENT

FIGS. 7 to 15 depict a method for manufacturing a semiconductor memory cell according to the present invention. In the present embodiment, the memory cell has a floating gate with predetermined length and width, and source and drain regions (9B and 9A).

Figure 7:
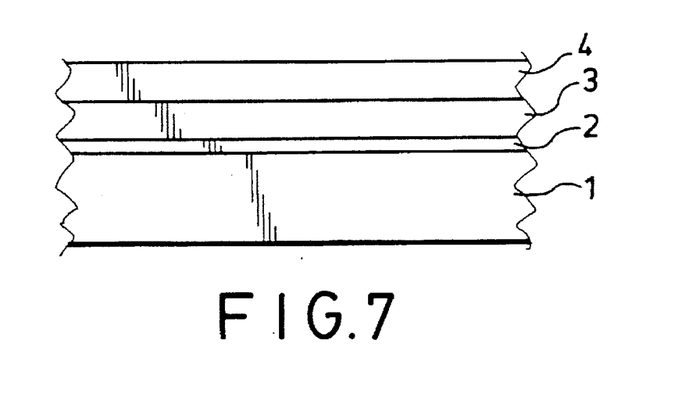
FIGS. 7 to 15 depict the steps of a method for manufacturing a semiconductor memory cell with a floating gate having a predetermined length and source and drain regions according to the present invention.
Figure 8:
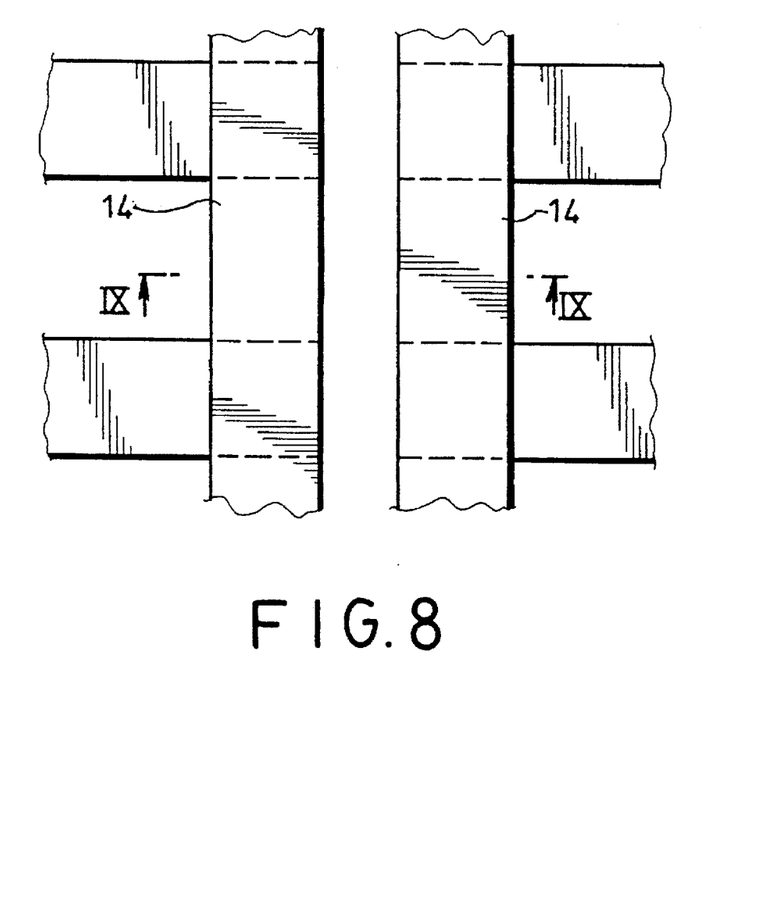
Figure 9:
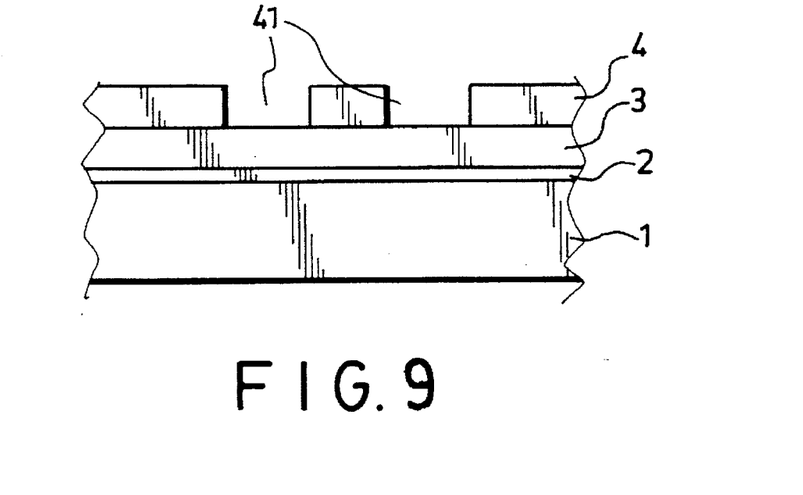
Figure 10:
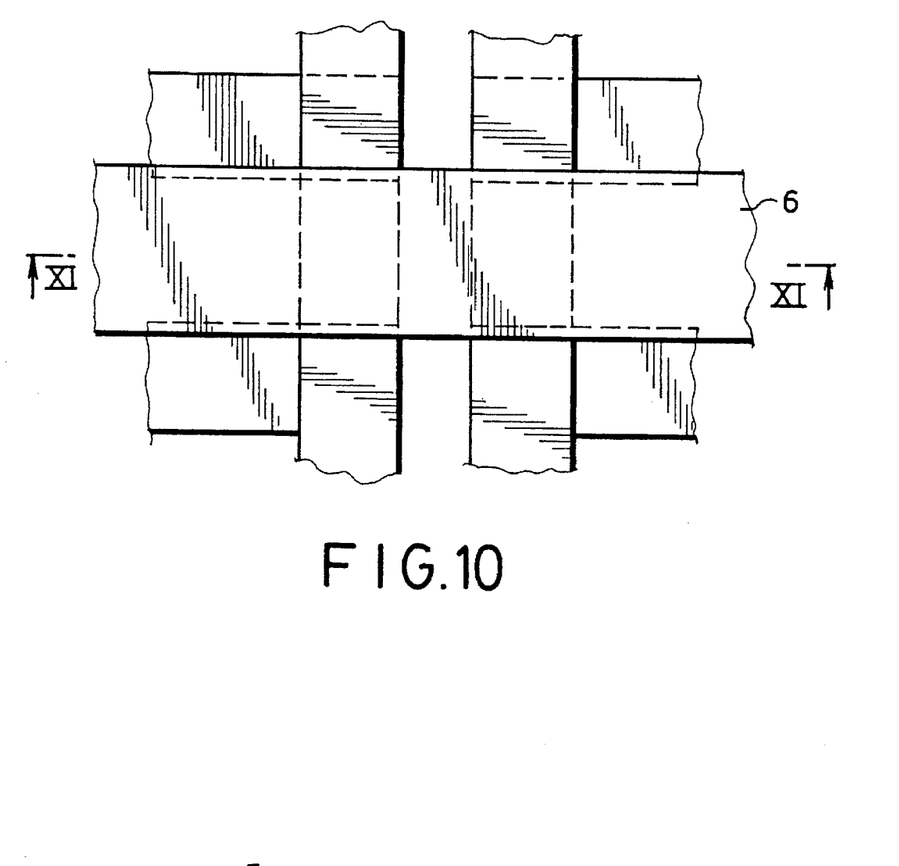
Figure 11:
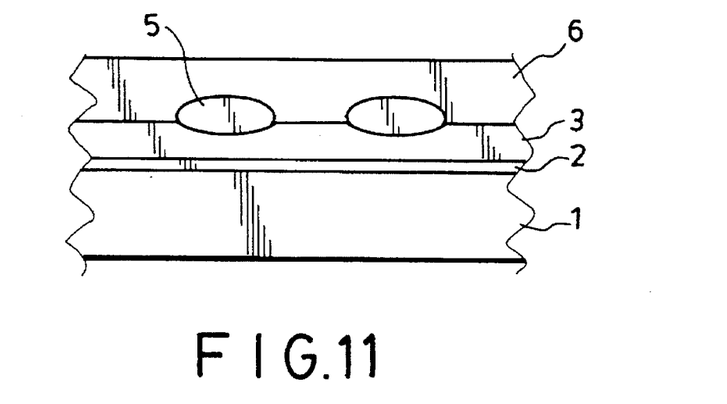
Figure 12:
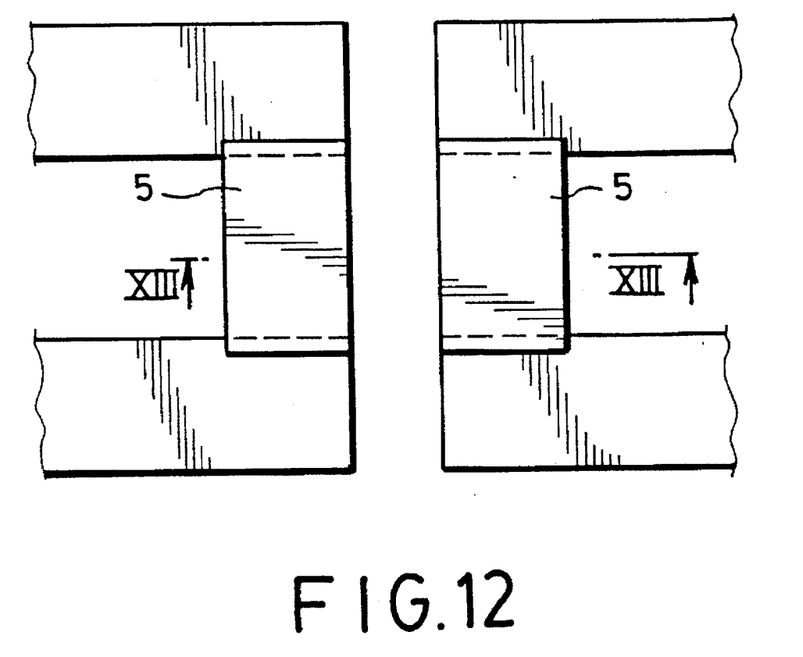
Figure 13:
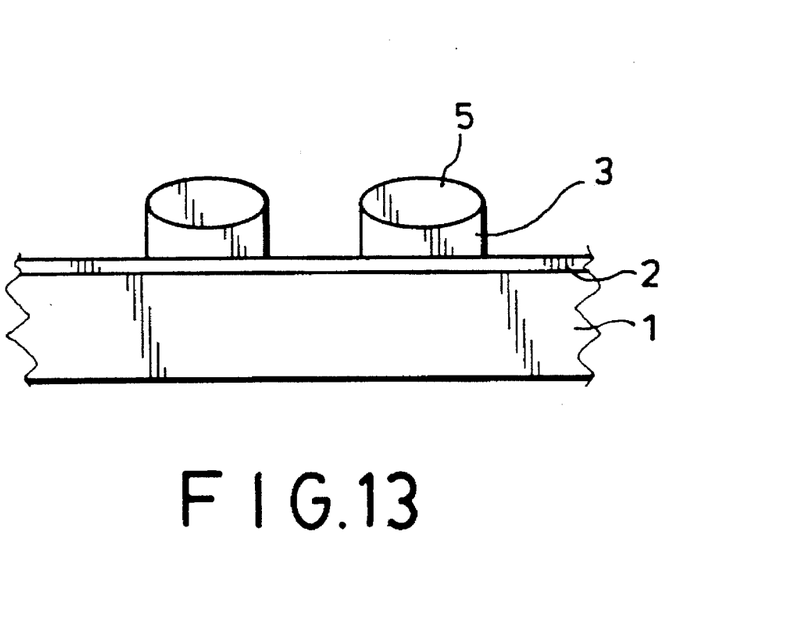
Figure 14:
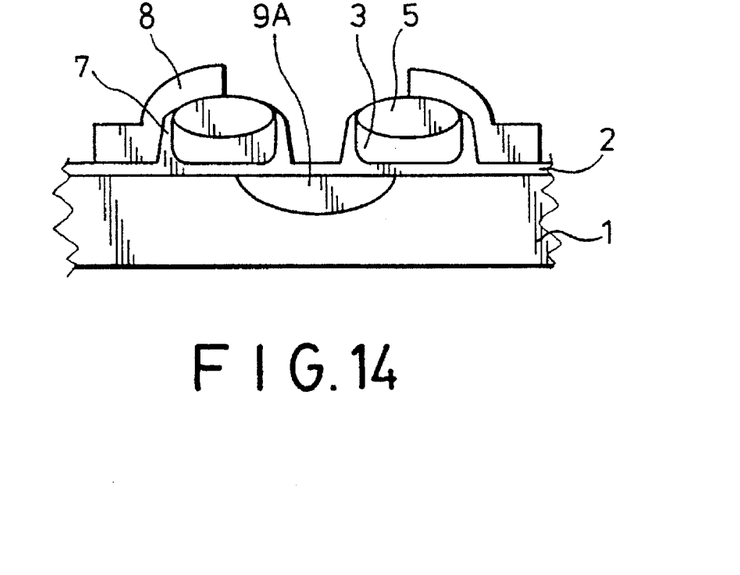
Figure 15:
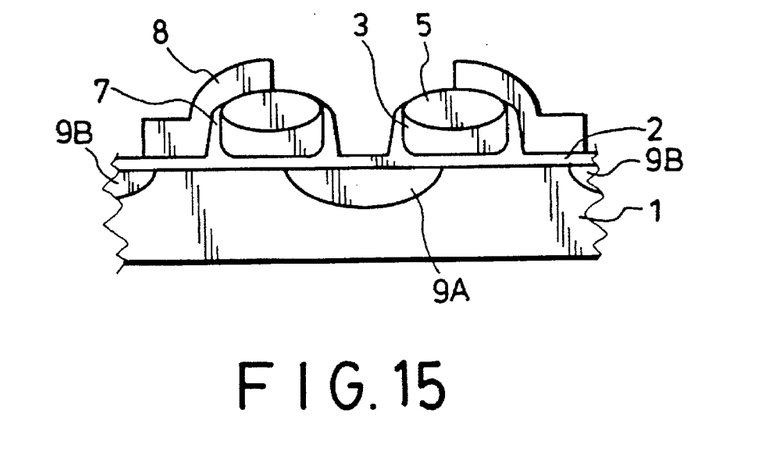
Figure 17:
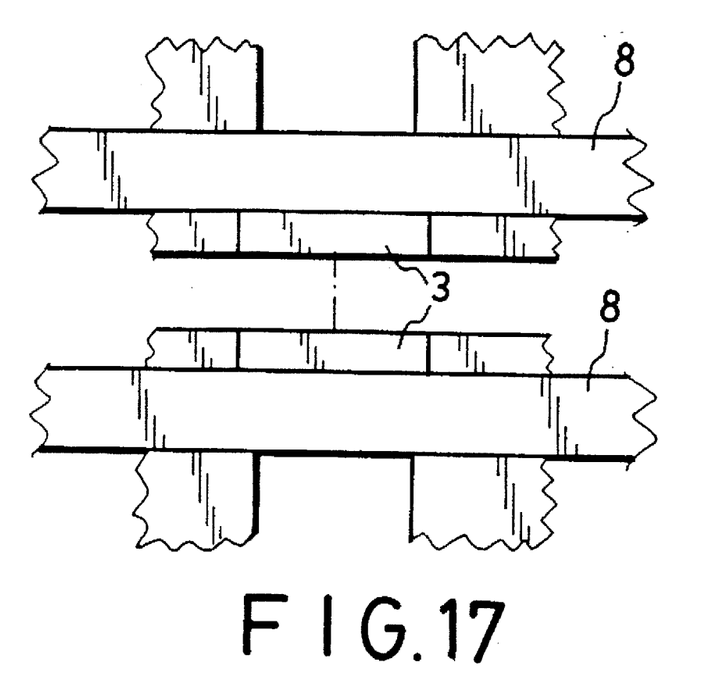
FIG. 17 is a top view showing the semiconductor memory cell manufactured by the method in accordance with the present invention.

With reference to FIG. 7, a thin oxide layer 2 of about 100 Å–180 521 is grown over a semiconductor substrate 1 in which a first-type impurity has been implanted. A first polysilicon layer 3 of about 2000 Å is deposited over the thin oxide layer 2. A silicon nitride layer 4 of about 1500 Å is deposited over the first polysilicon layer 3. Then, with reference to FIG. 9 which is a sectional view taken along the line IX—IX in FIG. 8, the silicon nitride layer 4 is masked and etched down to the first polysilicon layer 3 so as to form oxide receiving grooves 41 in the silicon nitride layer 4. Each of the oxide receiving grooves 41 has a longitudinal axis parallel to a longitudinal axis of the floating gate of a respective memory cell to be formed and is longer than the predetermined width of the floating gate of the respective memory cell to be formed. Each of the oxide receiving grooves 41 further has a width equal to the length of the floating gate of the respective memory cell to be formed and overlaps a respective floating gate region to be defined on the first polysilicon layer 3. As illustrated in FIG. 11 which is a sectional view taken along the line XI—XI in FIG. 10, a polysilicon oxide layer 5 is grown in each of the oxide receiving grooves. The silicon nitride layer 4 is removed. A mask 6, which is transverse to the polysilicon oxide layer 5 and which has a width equal to the predetermined width of the floating gate to be formed, is then provided to cover a portion of each polysilicon oxide layer 5, which portion is directly above the respective floating gate region. Then, the remaining portion of each polysilicon oxide layer 5 not covered by the mask 6 is etched. Referring now to FIG. 13 which is a sectional view taken along the line XIII—XIII in FIG. 12, the mask 6 is removed. Then, the first polysilicon layer 3 is etched with the portion of each polysilicon oxide layer 5 serving as a mask so as to form the floating gates. As illustrated in FIG. 14, a gate oxide layer 7 is grown over the floating gates. A second polysilicon layer 8 is deposited over the gate oxide layer 7. The second polysilicon layer 8 is masked and etched to define the control gates. There are two control gates shown in FIG. 14, each of which has a longitudinal axis parallel to that of the respective floating gate, a first edge positioned above the respective floating gate and a second edge positioned on the gate oxide layer 7. As illustrated in FIGS. 14 and 15, second-type impurities are implanted in the drain and source regions (9B and 9A). FIG. 17 is a schematic top view illustrating two memory cells manufactured by the method of the present invention. The memory cells are completed by using standard CMOS processes, such as providing a passivation layer (not shown) and metallization and electrodes that allow conduction of signals to and from external circuitry.

It is noted that, in the present embodiment, the first-type impurity is P-type impurity, while the second-type impurities are N-type impurities.

Figure 16A:
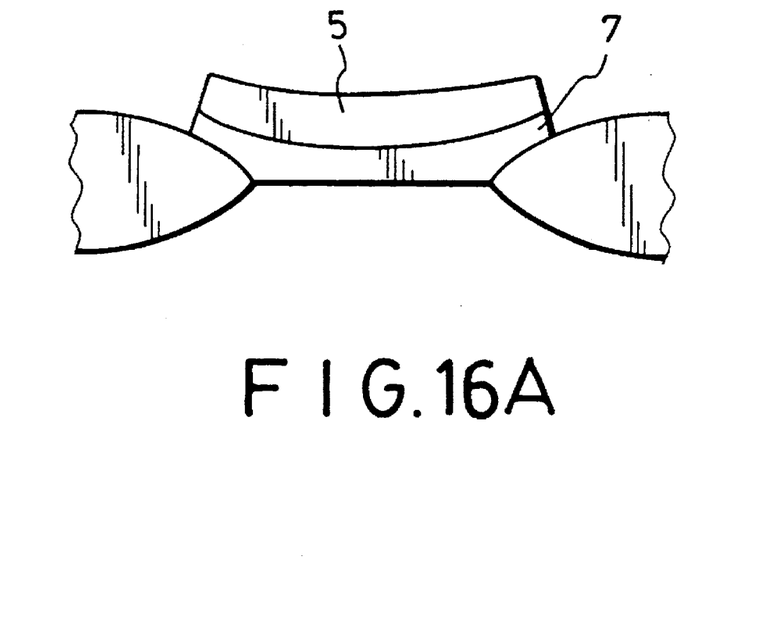
FIG. 16A is a sectional view showing the semiconductor memory cell manufactured by the method in accordance with the present invention, taken along a line parallel to the longitudinal axis of the floating gate.
Figure 16B:
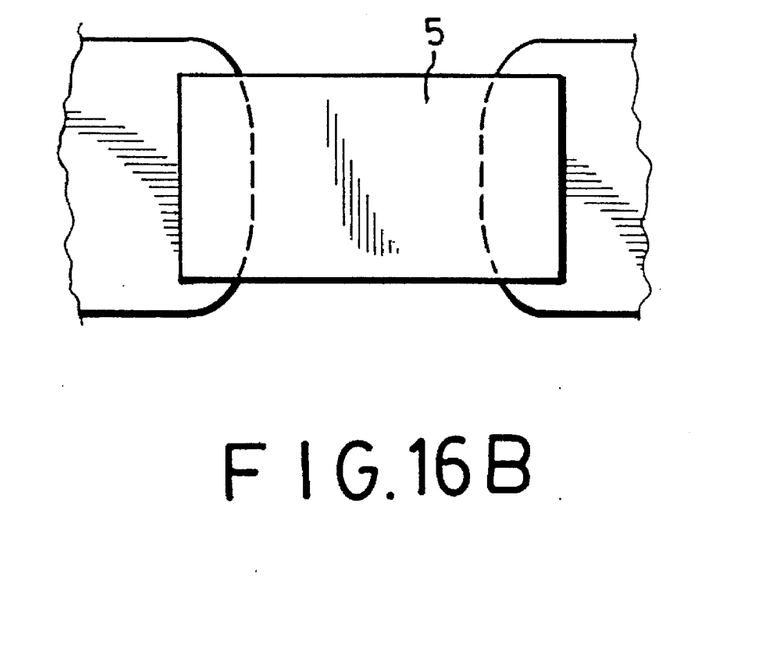
FIG. 16B is a top view of the semiconductor memory cell of FIG. 16A.

Referring now to FIGS. 16A and 16B, it is noted that presence of two sharp angle portions of the floating gate of each memory cell manufactured along longitudinal axis by the method of the present invention is obviated when compared to the floating gate illustrated in FIGS. 6A and 6B.

While the present invention has been described in connection with what is considered the most practical and preferred embodiment, it is understood that this invention is not limited to the disclosed embodiment, but is intended to cover various arrangements included within the spirit and scope of the broadest interpretation so as to encompass all such modifications and equivalent arrangements.

We claim:

1. A method for manufacturing a semiconductor memory cell with a floating gate, comprising the steps of:
   (a) growing a thin oxide layer over a semiconductor substrate;
   (b) depositing a polysilicon layer over said thin oxide layer;
   (c) depositing a silicon nitride layer over said polysilicon layer;
   (d) masking and etching said silicon nitride layer down to said polysilicon layer so as to form an oxide receiving groove in said silicon nitride layer, said oxide receiving groove having a longitudinal axis parallel to a longitudinal axis of the floating gate to be formed and being longer than the width of the floating gate to be formed, and the width of the receiving groove in latitudal axis is equal to the length of the floating gate to be formed, said oxide receiving groove overlapping a floating gate region to be defined on said polysilicon layer;
   (e) growing a polysilicon oxide layer in said oxide receiving groove;
   (f) removing said silicon nitride layer;
   (g) providing a mask which is transverse to said polysilicon oxide layer and which has a width equal to the width of the floating gate to be formed, said mask covering a portion of said polysilicon oxide layer which is directly above the floating gate region;
   (h) etching remaining portion of said polysilicon oxide layer not covered by said mask;
   (i) removing said mask; and
   (j) etching said polysilicon layer with said portion of said polysilicon oxide layer serving as a mask so as to form the floating gate.

2. A method for manufacturing an erasable nonvolatile memory cell with a floating gate and source and drain regions spaced by a channel, said method comprising the steps of:

(a) growing a thin oxide layer over a semiconductor substrate;

(b) depositing a first polysilicon layer over said thin oxide layer;

(c) depositing a silicon nitride layer over said first polysilicon layer;

(d) masking and etching said silicon nitride layer down to said first polysilicon layer so as to form an oxide receiving groove in said silicon nitride layer, said oxide receiving groove having a longitudinal axis parallel to a longitudinal axis of the floating gate to be formed and being longer than the width of the floating gate to be formed, and the width of the receiving groove in latitudal axis being equal to the length of the floating gate to be formed, said oxide receiving groove overlapping a floating gate region to be defined on said first polysilicon layer;

(e) growing a polysilicon oxide layer in said oxide receiving groove;

(f) removing said silicon nitride layer;

(g) providing a mask which is transverse to said polysilicon oxide layer and which has a width equal to the width of the floating gate to be formed, said mask covering a portion of said polysilicon oxide layer which is directly above the floating gate region;

(h) etching remaining portion of said polysilicon oxide layer not covered by said mask;

(i) removing said mask;

(j) etching said first polysilicon layer with said portion of said polysilicon oxide layer serving as a mask so as to form the floating gate;

(k) growing a gate oxide layer over the floating gate;

(l) depositing a second polysilicon layer over said gate oxide layer;

(m) masking and etching said second polysilicon layer to define a control gate having a longitudinal axis parallel to that of the floating gate, said control gate further having a first edge positioned above the floating gate and a second edge positioned on said gate oxide layer; and (n) implanting impurities in the drain and source regions.

* * * * *